(12) United States Patent
Hardee

(10) Patent No.: US 6,580,306 B2
(45) Date of Patent: Jun. 17, 2003

(54) SWITCHING CIRCUIT UTILIZING A HIGH VOLTAGE TRANSISTOR PROTECTION TECHNIQUE FOR INTEGRATED CIRCUIT DEVICES INCORPORATING DUAL SUPPLY VOLTAGE SOURCES

(75) Inventor: Kim Carver Hardee, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 09/803,318

(22) Filed: Mar. 9, 2001

(65) Prior Publication Data

US 2002/0125919 A1 Sep. 12, 2002

(51) Int. Cl.[7] .................... H03K 5/08; H03K 17/16
(52) U.S. Cl. ............... 327/328; 327/112; 327/391; 327/434
(58) Field of Search .................. 327/310, 313, 327/327, 328, 379, 389, 391, 108, 112, 427, 434; 326/87, 83; 361/91

(56) References Cited

U.S. PATENT DOCUMENTS

| | | | | |
|---|---|---|---|---|
| 3,623,023 A | * | 11/1971 | Oleksiak | 327/427 |
| 4,069,430 A | * | 1/1978 | Masuda | 326/87 |
| 5,389,842 A | * | 2/1995 | Hardee | 327/379 |
| 5,748,025 A | * | 5/1998 | Ng et al. | 327/112 |
| 6,266,291 B1 | * | 7/2001 | Sher et al. | 365/226 |
| 6,320,414 B1 | * | 11/2001 | Annema et al. | 326/87 |

* cited by examiner

Primary Examiner—Toan Tran
(74) Attorney, Agent, or Firm—William J. Kubida; Hogan & Hartson LLP

(57) ABSTRACT

A switching circuit incorporating a high voltage transistor protection technique for use in an integrated circuit device having dual voltage supplies which extends the maximum pumped voltage ("VCCP") for reliable MOS transistor operation to VCCP=VTN+(2*VCC), where VTN is the threshold voltage of the transistor and VCC is the supply voltage level. This is effectuated by adding an additional relatively thick gate oxide transistor in series with the relatively thin gate oxide MOS N-channel transistors in a conventional high voltage switching circuit to increase the reliable maximum voltage for the high voltage power supply.

28 Claims, 2 Drawing Sheets

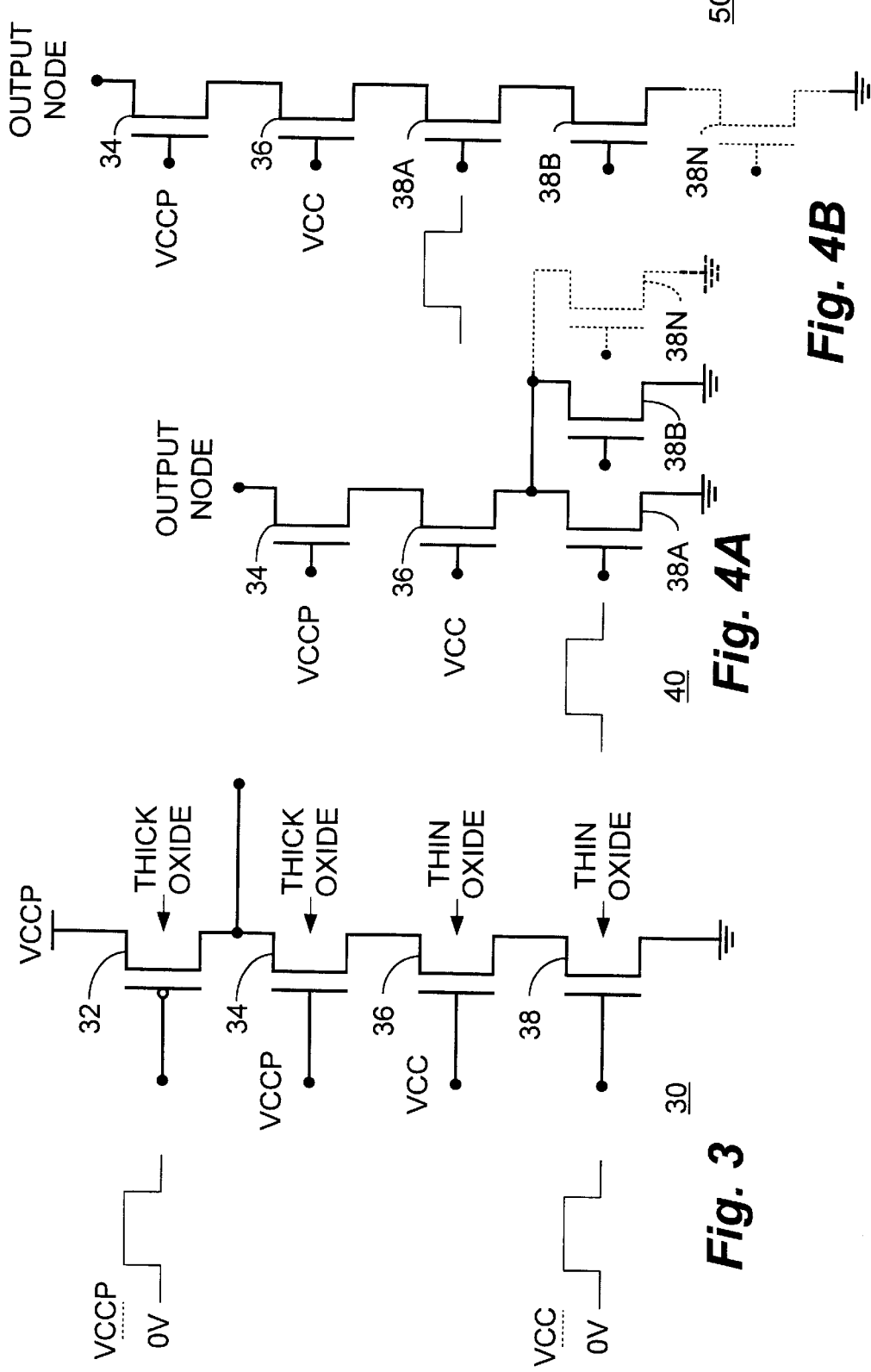

SWITCHING CIRCUIT UTILIZING A HIGH VOLTAGE TRANSISTOR PROTECTION TECHNIQUE FOR INTEGRATED CIRCUIT DEVICES INCORPORATING DUAL SUPPLY VOLTAGE SOURCES

CROSS REFERENCE TO RELATED PATENT APPLICATIONS

The present invention is related to the subject matter disclosed in U.S. patent application Ser. No. 09/803,315 for: "Negative Voltage Driver Circuit Technique Having Reduced Current Flow to the Negative Supply Voltage Source" filed on even date herewith and assigned to the assignee of the present invention, the disclosure of which is herein specifically incorporated by this reference.

BACKGROUND OF THE INVENTION

The present invention relates, in general, to the field of integrated circuit ("IC") devices. More particularly, the present invention relates to a switching circuit utilizing a high voltage transistor protection technique for integrated circuit devices having dual voltage supplies.

In certain integrated circuit devices (e.g. some memory ICs) a high voltage supply level ("VCCP") may be required for proper device operation. Should this voltage be equal to or less than twice the supply voltage ("VCC", i.e. VCCP≦2*VCC), then a switching circuit comprising a relatively thick gate oxide P-channel transistor in series with a pair of series connected N-channel transistors may be coupled between VCCP and a reference voltage level (VSS or circuit ground) with the gate of the P-channel device coupled to a switched source of VCCP, the gate of the intermediate N-channel device coupled to VCC and the gate of the remaining N-channel device coupled to a switched source of VCC.

However, in those applications wherein the high voltage supply level is more than twice the device supply voltage (i.e. VCCP>2*VCC) and relatively thick gate oxide thickness transistors are used, the associated thin gate oxide transistors must still be protected from possible high gate oxide voltage stress.

SUMMARY OF THE INVENTION

The switching circuit incorporating a high voltage transistor protection technique of the present invention extends the maximum pumped voltage ("VCCP") for reliable MOS transistor operation to VCCP=VTN+(2*VCC). This is effectuated by adding an additional relatively thick gate oxide transistor in series with the thin gate oxide MOS N-channel transistors in a conventional high voltage switching circuit to increase the reliable maximum voltage for the high voltage power supply.

Particularly disclosed herein is an integrated circuit device including a switching circuit comprising first and second series coupled MOS transistors having a gate oxide of a first thickness, each of the first and second MOS transistors having a gate terminal thereof. Third and fourth MOS series coupled transistors are also provided having a gate oxide of a second thickness lesser than the first thickness, each of the third and fourth MOS transistors having a gate terminal thereof. The first, second, third and fourth MOS transistors are coupled in series between a high voltage source and a reference voltage source with an output node defined intermediate the first and second MOS transistors. A first signal input is coupled to the gate terminal of the first transistor for receiving a first input signal capable of transitioning between a level of the high voltage source and a level of the reference voltage source with the gate terminal of the second transistor being coupled to the high voltage source. A supply voltage source having a voltage level lesser than that of the high voltage source is coupled to the gate terminal of the third transistor. A second signal input is coupled to the gate terminal of the fourth transistor for receiving a second input signal capable of transitioning between a level of the supply voltage source and a level of the reference voltage source.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 3 illustrates a switching circuit in accordance with the present invention appropriate for those circumstances wherein VCCP≧VTN+(2*VCC);

FIG. 4A illustrates an alternative embodiment of a switching circuit in accordance with the present invention having N-channel transistors provided and functioning in a manner corresponding to those in the preceding FIG. 3 configured in a NOR logic configuration; and FIG. 4B illustrates another alternative embodiment of a switching circuit in accordance with the present invention having N-channel transistors provided and functioning in a manner corresponding to those in the preceding FIG. 3 configured in a NAND logic configuration.

DESCRIPTION OF A REPRESENTATIVE EMBODIMENT

Figure 1:
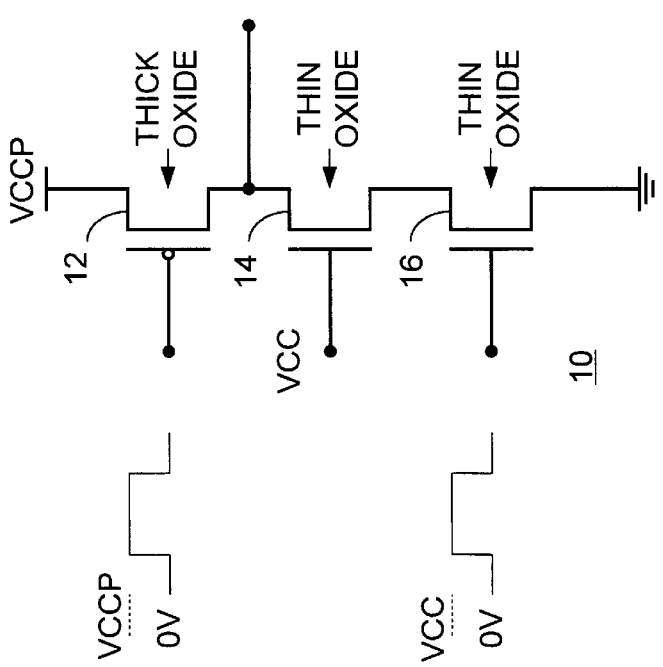
FIG. 1 illustrates a conventional switching circuit configuration appropriate for those circumstances wherein VCCP≦2*VCC.

With reference now to FIG. 1, a conventional switching circuit 10 is shown appropriate for applications wherein VCCP≦2*VCC. VCC may range between approximately 1.4 volts to 1.6 volts with a nominal value of 1.5 volts while VCCP may range substantially between 2.8 volts to 3.2 volts with a nominal value of 3.0 volts. The switching circuit 10 comprises a P-channel transistor 12 having a relatively thick gate oxide coupling a pumped voltage source VCCP to an output node. The transistor 12 is coupled in series with a pair of series connected, relatively thin gate oxide N-channel transistors 14 and 16 coupling the output node to circuit ground (or "VSS"). The relatively thin gate oxide may be substantially 32–37 Angstroms ("Å") in thickness with a nominal value of 35 Å while the relatively thick gate oxide may be in the range of 75–88 Å with a nominal value of 82 Å.

The gate of the P-channel transistor 12 is coupled to a switched VCCP source while the gate of the lower N-channel transistor 16 is coupled to a switched VCC source. The gate of the intermediate N-channel transistor 14 is coupled to the supply voltage source VCC.

As previously mentioned, in those instances wherein VCCP≦2*VCC, the switching circuit 10 may be successfully implemented. However, care must be taken such that the voltage across the gate oxide of the thin gate oxide transistors 14 and 16 does not exceed VCC while the gates of the thin oxide devices may also not transition with a drain-to-source voltage of greater than VCC. The switching circuit 10 effectuates this if VCCP≦2*VCC. Transistor 14 is "on" at all times due to the constant VCC level applied to its gate with a small voltage drain-to-source ("VDS") and a voltage drain-to-gate ("VDG") or voltage source-to-gate ("VSG")≦VCC. Transistor 16 drain voltage ("VD") equal to VCC−VTN (threshold voltage) and its maximum VDG (or VSG)<VCC.

For those cases wherein VCCP≧2*VCC, another solution must be found as if the switching circuit 10 were used, then VDG for transistor 14 would be greater than VCC when the output node is at VCCP.

Figure 2:
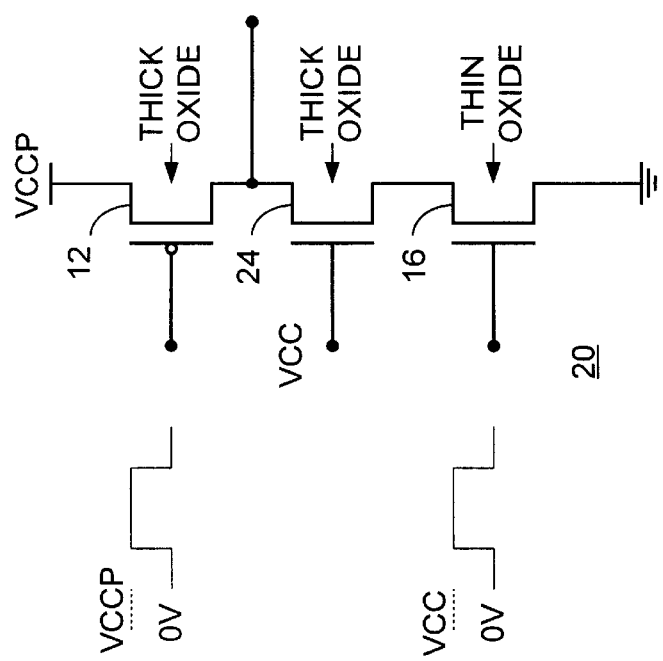
FIG. 2 illustrates a corresponding switching circuit configuration appropriate for those circumstances wherein VCCP≧2*VCC but in which the intermediate N-channel devices presents an undesirably high impedance.

With reference additionally now to FIG. 2, a switching circuit 20 is shown appropriate for applications wherein VCCP≧2*VCC. The switching circuit 20 comprises a similar P-channel transistor 12 having a relatively thick gate oxide coupling a pumped voltage source VCCP to an output node. The transistor 12 is coupled in series with a pair of series connected N-channel transistors 24 and 16 coupling the output node to circuit ground (or "VSS"). In this instance, while the transistor 16 still has a relatively thin gate oxide, the transistor 24 has replaced the transistor 14 of the preceding figure with one including a relatively thick gate oxide.

As previously, the gate of the P-channel transistor 12 is coupled to a switched VCCP source while the gate of the lower N-channel transistor 16 is coupled to a switched VCC source. The gate of the intermediate N-channel transistor 24 is coupled to the supply voltage source VCC.

The transistor 24 in the switching circuit 20 has a relatively thick gate oxide in this instance and replaces the relatively thin gate oxide transistor 14 of FIG. 1. For transistor 24, the maximum VDS, VDG or VSG can be at a level of VCCP and still be reliable. Nevertheless, the transistor 24 will have a very high impedance because the gate voltage applied to it is only VCC. The gate oxide thickness of thick oxide transistors is generally more than twice the thickness of corresponding thin oxide transistors. Also, the channel lengths of thick oxide transistors are also generally greater than twice the channel length of thin oxide devices. These two factors will cause the transistor 24 to have a much higher impedance than that of the corresponding transistor 14 of FIG. 1 (on the order of four times greater). This will cause the output node to pull down at an unacceptably slow rate and while transistor 24 can also be made very large (i.e. a greater channel width), this would be inherently self-limiting since increasing the size of transistor 24 will also add additional capacitance to the pull-down path.

With reference additionally now to FIG. 3, a switching circuit 30 in accordance with the present invention is shown appropriate for those circumstances wherein VCCP≧VTN+ (2*VCC). The switching circuit 30 comprises a P-channel transistor 32 having a relatively thick gate oxide coupling a pumped voltage source VCCP to an output node. The transistor 32 is coupled in series with a string of series connected N-channel transistors 34, 36 and 38 coupling the output node to circuit ground (or "VSS"). In this instance, the transistors 36 and 38 have a relatively thin gate oxide, while the transistors 32 and 34 have a relatively thick gate oxide.

As in the previous circuits, the gate of the P-channel transistor 12 is coupled to a switched VCCP source while the gate of the lowest N-channel transistor 38 is coupled to a switched VCC source. The gate of the upper intermediate N-channel transistor 34 is coupled to the pumped supply voltage source VCCP while the gate of the lower intermediate N-channel transistor 36 is coupled to the supply voltage source VCC.

Unlike the switching circuits 10 and 20 shown in the preceding figures, the switching circuit 30 includes an added transistor 34 to protect transistor 36. This circuit will function reliably if VCCP−VTN ≦2*VCC, where VTN is the threshold voltage of a relatively thick oxide transistor, typically on the order of about 0.9 volts. The VDS of transistor 34 is small and the VDG of transistor 36 is less than or equal to VCC for the condition described above. While the pull-down rate on the output node is somewhat impacted due to the addition of the series connected transistor 34, but not nearly as much as that which would be experienced with the switching circuit 20 of FIG. 2. The switching circuit 30 extends the safe maximum VCCP voltage from 2*VCC to (2*VCC)+VTN.

With reference additionally now to FIG. 4A, an alternative embodiment of a switching circuit 40 in accordance with the present invention is shown having N-channel transistors 34, 36 and 38 provided and functioning in a manner corresponding to those depicted and described with respect to the preceding FIG. 3 (wherein P-channel transistor 32 functions in a normal manner) configured in a NOR logic configuration in which one or more N-channel transistors 38A, 38B through 38N may be utilized. Correspondingly, FIG. 4B illustrates yet another alternative embodiment of a switching circuit 50 in accordance with the present invention wherein any number of N-channel transistors 38A, 38B through 38N may be coupled in series to configure the switching circuit 50 into a NAND logic configuration. Any combination of serial and parallel coupled transistors 38A, 38B through 38N may be used to configure appropriate logic switching circuits for a specified application.

While there have been described above the principles of the present invention in conjunction with a specific switching circuit implementation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including a switching circuit comprising:

first and second series coupled MOS transistors having a gate oxide of a first thickness, each of said first and second MOS transistors having a gate terminal thereof;

third and fourth MOS series coupled transistors having a gate oxide of a second thickness lesser than said first thickness, each of said third and fourth MOS transistors having a gate terminal thereof, said first, second, third and fourth MOS transistors being coupled in series between a high voltage source and a reference voltage source with an output node defined intermediate said first and second MOS transistors;

a first signal input coupled to said gate terminal of said first transistor for receiving a first input signal capable of transitioning between a level of said high voltage source and a level of said reference voltage source, said gate terminal of said second transistor being coupled to said high voltage source;

a supply voltage source coupled to said gate terminal of said third transistor; and a second signal input coupled to said gate terminal of said fourth transistor for receiving a second input signal capable of transitioning between a level of said supply voltage source and a level of said reference voltage source.

2. The integrated circuit device of claim 1 wherein said high voltage source is greater than two times said supply voltage source and less than or equal to two times said supply voltage source plus a threshold voltage of said second MOS transistor.

3. The integrated circuit device of claim 1 wherein said level of said high voltage source is substantially between 3.1 to 3.6 volts.

4. The integrated circuit device of claim 1 wherein said level of said supply voltage source is substantially between 1.4 to 1.6 volts.

5. The integrated circuit device of claim 1 wherein said first transistor comprises a P-channel device.

6. The integrated circuit device of claim 1 wherein said second, third and fourth transistors comprise N-channel devices.

7. The integrated circuit device of claim 1 wherein said first thickness is substantially 75 to 88 Angstroms.

8. The integrated circuit device of claim 1 wherein said second thickness is substantially 32 to 37 Angstroms.

9. The integrated circuit device of claim 1 wherein a ratio of said first thickness to said second thickness is substantially 2.35 to 1.

10. The integrated circuit device of claim 1 further comprising:

an additional MOS transistor in parallel with said fourth MOS transistor.

11. The integrated circuit device of claim 1 further comprising:

an additional MOS transistor in series with said fourth MOS transistor.

12. A high voltage protection technique for an integrated circuit device switching circuit including a first switching device having a thick gate oxide coupled in series with a pair of second and third series connected switching devices having a less thick gate oxide coupled between a high voltage source and a reference voltage level, a gate terminal of the first switching device being coupled to receive a first input signal variable between said reference voltage level and said high voltage source, a gate terminal of said second switching device being coupled to a supply voltage source and a gate terminal of said third switching device being coupled to receive a second input signal variable between said reference voltage level and said supply voltage source, said switching circuit including an output node intermediate said first and second switching devices and wherein the improvement comprises:

a fourth switching device intermediate said output node and said second switching device, said fourth switching device also having a relatively thick gate oxide and a gate terminal thereof coupled to said high voltage source.

13. The integrated circuit device of claim 12 wherein said high voltage source is greater than two times said supply voltage source and less than or equal to two times said supply voltage source plus a threshold voltage of said fourth MOS transistor.

14. The integrated circuit device of claim 12 wherein said level of said high voltage source is substantially between 3.1 to 3.6 volts.

15. The integrated circuit device of claim 12 wherein said level of said supply voltage source is substantially between 1.4 to 1.6 volts.

16. The integrated circuit device of claim 12 wherein said first transistor comprises a P-channel device.

17. The integrated circuit device of claim 12 wherein said second, third and fourth transistors comprise N-channel devices.

18. The integrated circuit device of claim 12 wherein said thick gate oxide is substantially between 75 to 88 Angstroms.

19. The integrated circuit device of claim 12 wherein said less thick gate oxide is substantially between 32 to 37 Angstroms.

20. The integrated circuit device of claim 12 wherein a ratio of said thick to said less thick gate oxide thicknesses is substantially 2.35 to 1.

21. The integrated circuit device of claim 12 further comprising:

an additional MOS transistor in parallel with said fourth MOS transistor.

22. The integrated circuit device of claim 12 further comprising:

an additional MOS transistor in series with said fourth MOS transistor.

23. An integrated circuit device including a switching circuit comprising:

a first MOS transistor having a gate oxide of a first thickness, said first MOS transistor having a gate terminal thereof;

second and third MOS series coupled transistors having a gate oxide of a second thickness lesser than said first thickness, each of said second and third MOS transistors having a gate terminal thereof, said first, second and third MOS transistors being coupled in series between an output node and a reference voltage source;

said gate terminal of said first transistor being coupled to a high voltage source and said gate terminal of said second transistor being coupled to a supply voltage source; and a signal input coupled to said gate terminal of said third transistor for receiving an input signal capable of transitioning between a level of said supply voltage source and a level of said reference voltage source.

24. The integrated circuit device of claim 23 further comprising:

an additional MOS transistor in parallel with said third MOS transistor.

25. The integrated circuit device of claim 23 further comprising:

an additional MOS transistor in series with said third MOS transistor.

26. A high voltage protection technique for an integrated circuit device switching circuit including first, second and third switching devices coupled in series between an output node and a reference voltage level, a gate terminal of said first switching device being coupled to a high voltage source, a gate terminal of said second switching device being coupled to receive a supply voltage source and a gate terminal of said third switching device being coupled to receive an input signal variable between said reference voltage level and said supply voltage source, wherein the improvement comprises:

said first switching device having a relatively thick gate oxide and said second and third switching devices having a less thick gate oxide.

27. The high voltage protection technique of claim 26 wherein said switching circuit further comprises:

an additional switching device in parallel with said third switching device.

28. The high voltage protection technique of claim 26 wherein said switching circuit further comprises:

an additional switching device in series with said third switching device.

* * * * *